United States Patent
Jung et al.

(10) Patent No.: US 9,941,881 B1
(45) Date of Patent: Apr. 10, 2018

(54) APPARATUS AND METHOD FOR LATCHING DATA INCLUDING AND-NOR OR OR-NAND GATE AND FEEDBACK PATHS

(71) Applicant: QUALCOMM Incorporated, San Diego, CA (US)

(72) Inventors: Changho Jung, San Diego, CA (US); Derek Yang, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/467,943

(22) Filed: Mar. 23, 2017

(51) Int. Cl.
*H03K 19/20* (2006.01)
*H03K 19/003* (2006.01)
*H03K 19/0948* (2006.01)

(52) U.S. Cl.
CPC ... *H03K 19/00323* (2013.01); *H03K 19/0948* (2013.01); *H03K 19/20* (2013.01)

(58) Field of Classification Search
CPC ......... H03K 19/00323; H03K 19/0948; H03K 19/20
USPC .......................................... 326/122; 327/218
See application file for complete search history.

(56) References Cited

U.S. PATENT DOCUMENTS

| | | | |
|---|---|---|---|
| 5,546,035 A | 8/1996 | Okamoto | |
| 5,646,547 A * | 7/1997 | Goetting | G01R 31/318516 326/37 |
| 5,719,513 A | 2/1998 | Kusumoto et al. | |
| 5,760,610 A * | 6/1998 | Naffziger | G06F 1/10 326/93 |
| 7,391,249 B2 | 6/2008 | Lee et al. | |

FOREIGN PATENT DOCUMENTS

EP 0720173 A1 7/1996
JP H0567963 A 3/1993

* cited by examiner

*Primary Examiner* — Daniel D Chang
(74) *Attorney, Agent, or Firm* — Loza & Loza, LLP/Qualcomm

(57) ABSTRACT

A latch circuit includes an AND-NOR gate, a NAND gate, and a NOR gate. The AND-NOR gate includes a first AND-input configured to receive input data and a second AND-input coupled to an output of the NAND gate. The AND-NOR gate includes a NOR-input coupled to an output of the NOR gate, and an output configured to generate output data. The NAND gate includes a first input coupled to the output of the AND-NOR gate and a second input configured to receive a clock signal. The NOR gate includes a first input coupled to the output of the AND-NOR gate and a second input configured to receive a complementary clock signal. During a first half clock cycle, the AND-NOR gate passes the data from the input to the output. During a second half clock cycle, the feedback configuration of the AND-NOR gate and the NOR gate latches the data.

14 Claims, 6 Drawing Sheets

APPARATUS AND METHOD FOR LATCHING DATA INCLUDING AND-NOR OR OR-NAND GATE AND FEEDBACK PATHS

BACKGROUND

Field

Aspects of the present disclosure relate generally to latch circuits, and in particular, to an apparatus and method for latching data including a AND-NOR gate or OR-NAND gate and a pair of feedback paths.

Background

A latch circuit is configured to receive data during a first half of a clock cycle, and latch the data during a second half of the clock cycle. The maximum frequency of a clock signal driving the latch circuit depends on the propagation delay between an input and output of the latch circuit. Reducing such delay would allow for the latch circuit to be operated at higher frequencies.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a AND-NOR gate configured to generate an output data signal at an output based on an input data signal, wherein the AND-NOR gate includes a first AND-input configured to receive the input data signal; a NAND gate including a first input coupled to the output of the AND-NOR gate, a second input configured to receive a clock signal, and an output coupled to a second AND-input of the AND-NOR gate; and a NOR gate including a first input coupled to the output of the AND-NOR gate, a second input configured to receive a complementary clock signal, and an output coupled to a NOR-input of the AND-NOR gate.

Another aspect of the disclosure relates to a method including logically ANDing an input data signal with a first signal to generate an intermediate data signal; logically NORing the intermediate data signal with a second signal to generate an output data signal; logically NANDing the output data signal with a clock signal to generate the first signal; and logically NORing the output data signal with a complementary clock signal to generate the second signal.

Another aspect of the disclosure relates to an apparatus including a OR-NAND gate configured to generate an output data signal at an output based on an input data signal, wherein the OR-NAND gate includes a first OR-input configured to receive the input data signal; a NAND gate including a first input coupled to the output of the OR-NAND gate, a second input configured to receive a clock signal, and an output coupled to a NAND-input of the OR-NAND gate; and a NOR gate including a first input coupled to the output of the OR-NAND gate, a second input configured to receive a complementary clock signal, and an output coupled to a second OR-input of the OR-NAND gate.

Another aspect of the disclosure relates to a method including logically ORing an input data signal with a first signal to generate an intermediate data signal; logically NANDing the intermediate data signal with a second signal to generate an output data signal; logically NANDing the output data signal with a clock signal to generate the second signal; and logically NORing the output data signal with a complementary clock signal to generate the first signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
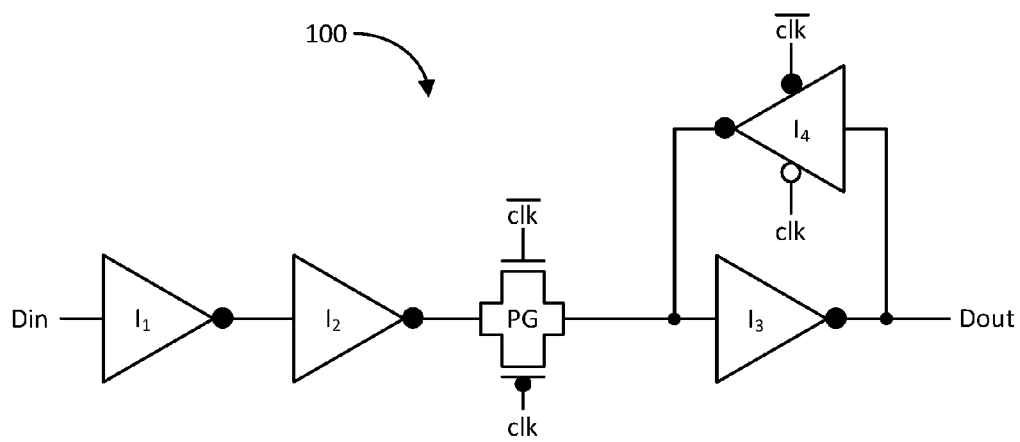
FIG. 1A illustrates a schematic diagram of an exemplary latch circuit in accordance with an aspect of the disclosure.

FIG. 1A illustrates a schematic diagram of an exemplary latch circuit 100 in accordance with an aspect of the disclosure. The latch circuit 100 includes a first inverter $I_1$, a second inverter $I_2$, a pass gate (PG), and cross-coupled inverters $I_3$ and $I_4$, all coupled in series between an input configured to receive an input data signal Din, and an output configured to produce an output data signal Dout.

The pass gate PG includes a control input configured to receive a complementary clock signal $\overline{clk}$ and a complementary control input configured to receive a clock signal. The inverter $I_4$ includes a complementary control input configured to receive the complementary clock signal $\overline{clk}$, and a control input configured to receive the clock signal clk.

Figure 1B:
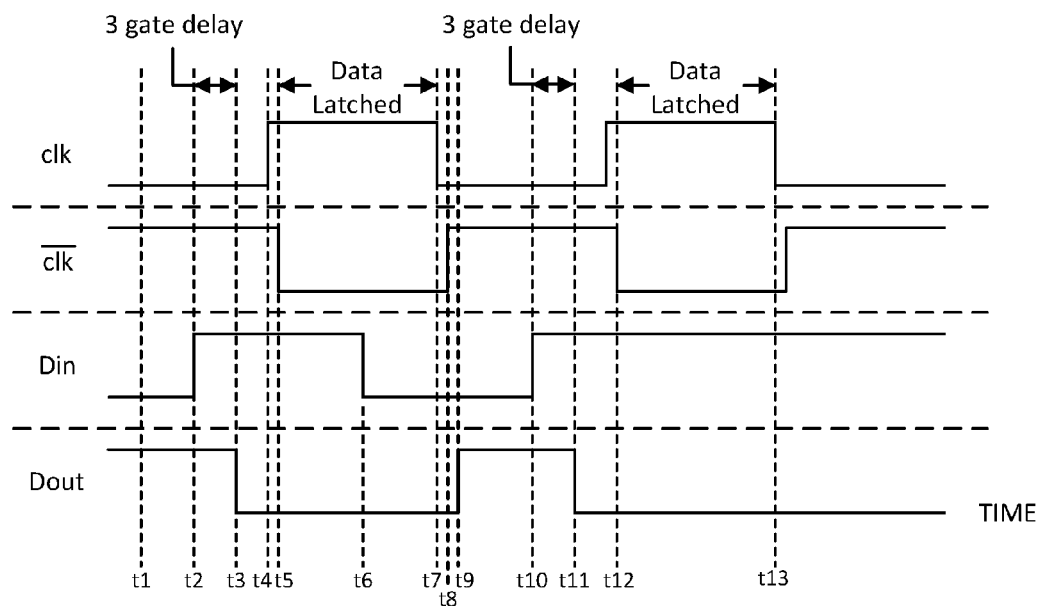
FIG. 1B illustrates a timing diagram of a set of exemplary signals related to an operation of the latch circuit of FIG. 1A in accordance with another aspect of the disclosure.

FIG. 1B illustrates a timing diagram of a set of exemplary signals related to an operation of the latch circuit 100 in accordance with another aspect of the disclosure. The timing diagram includes four (4) rows for depicting the clock signal clk, complementary clock signal $\overline{clk}$, input data signal Din, and output data signal Dout logic state variation over time, respectively.

Prior to time t4, the clock signal clk is at a low logic voltage and the complementary clock signal $\overline{clk}$ is at a high logic voltage. As a result, the pass gate PG is turned on and the fourth inverter $I_4$ is disabled or tristated. In this configuration, three (3) inverters $I_1$, $I_2$, and $I_3$ separate the input from the output of the latch circuit 100. Accordingly, the output data signal Dout tracks (albeit, inversely) the input data signal Din. For instance, at time t1, when the input data signal Din is at a low logic voltage, the output data signal Dout is at a high logic voltage. At time t2, when the input data signal Din transitions from a low to a high logic voltage, the output data signal Dout responsively transitions from a high to a low logic voltage at time t3 (e.g., after three (3) gate delays from time t2 due to the inverters $I_1$, $I_2$, and $I_3$).

At times t4 and t5, the clock signal clk transitions from a low to a high logic voltage and the complementary clock signal $\overline{clk}$ responsively transitions from a high to a low logic voltage, respectively. As a result, the pass gate PG is turned off and the fourth inverter $I_4$ is enabled. The pass gate PG, being turned off, prevents signal and/or noise at the input from affecting the latching of the output data signal Dout by the cross-coupled inverters $I_3$ and $I_4$. The fourth inverter $I_4$, being turned on, causes the cross-coupled inverters $I_3$ and $I_4$ to latch the output data signal Dout. As long as the clock signal clk is high and the complementary clock signal $\overline{clk}$ is low, as indicated between times t5 and t7, the output data signal Dout is kept latched by the cross-coupled inverters $I_3$ and $I_4$, even though the input data signal Din changes states as indicated at time t6.

At times t7 and t8, the clock signal clk transitions from a high to a low logic voltage and the complementary clock signal $\overline{clk}$ responsively transitions from a low to a high logic voltage, respectively. As a result, the pass gate PG turns on and the fourth inverter $I_4$ becomes disabled or tristated. In this configuration, the latch circuit 100 is configured to receive new input data. Accordingly, at time t8, the input data signal Din is at a low logic voltage. In response to the clock signal changing states, the output data signal Dout transitions from a low to a high logic voltage at time t9.

At time t10, the input data signal Din transitions from a low to a high logic voltage. At time t11, after a three (3) gate delay caused by inverters $I_1$, $I_2$, and $I_3$, the output data signal Dout transitions from a high to a low logic voltage. Between times t12 and t13, when the clock signal clk is high and the complementary clock signal $\overline{clk}$ is low, the output data signal Dout, at a low logic voltage, is latched by the cross-coupled inverters $I_3$ and $I_4$.

An issue with the latch circuit 100 is that the delay between the input and output is three (3) gate delays, i.e., the delays of the first inverter $I_1$, second inverter $I_2$, and third inverter $I_3$. Because of such delay, the frequency of the clock signal clk needs to be set in order to accommodate that delay. For instance, there should be sufficient margin between time t3 (when the input data signal Din has propagated to the output) and time t4 (when the clock signal clk transitions from a low to a high logic voltage) to reliably latch the data without setup and/or hold timing violations. Thus, such delay impacts the performance of the latch circuit 100.

Figure 2A:
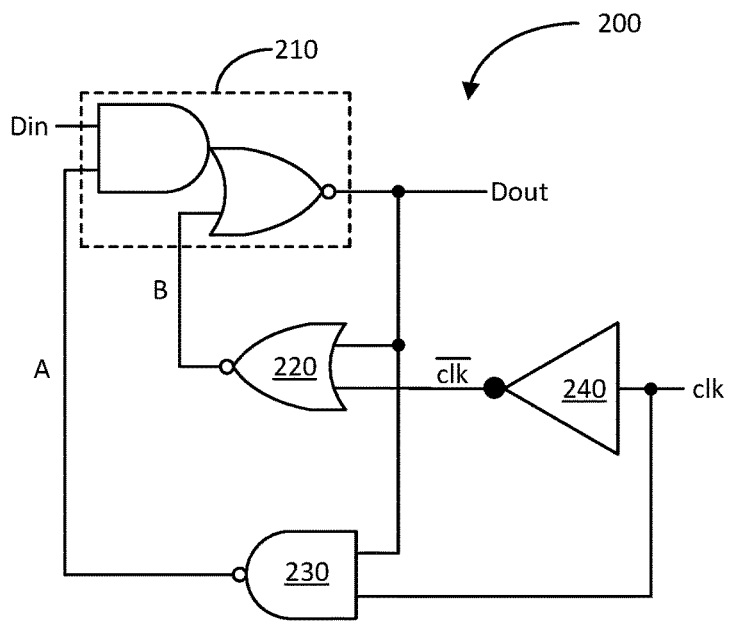
FIG. 2A illustrates a schematic diagram of another exemplary latch circuit in accordance with an aspect of the disclosure.

FIG. 2A illustrates a schematic diagram of another exemplary latch circuit 200 in accordance with another aspect of the disclosure. The latch circuit 200 includes an AND-NOR gate 210, a NOR gate 220, a NAND gate 230, and an inverter 240. Although, symbolically, the AND-NOR gate 210 is shown to include two gates, the AND-NOR gate operates as a single gate, as discussed further herein with reference to an exemplary detailed embodiment.

The AND-NOR gate 210 includes a first AND-input configured to receive an input data signal Din. The AND-NOR gate 210 includes a second AND-input coupled to an output of NAND gate 230. The AND-NOR gate 210 includes a NOR-input coupled to an output of the NOR gate 220. Operationally, the output of the AND portion of the AND-NOR gate 210 is internally coupled to another an input of the NOR portion of the AND-NOR gate 210. The output of the AND-NOR gate 210, which produces an output data signal Dout, is coupled to respective first inputs of the NOR gate 220 and the NAND gate 230.

The NAND gate 230 includes a second input configured to receive a clock signal clk. The NOR gate 220 includes a second input configured to receive a complementary clock signal $\overline{clk}$ generated by the inverter 240 in response to the clock signal clk.

Figure 2B:
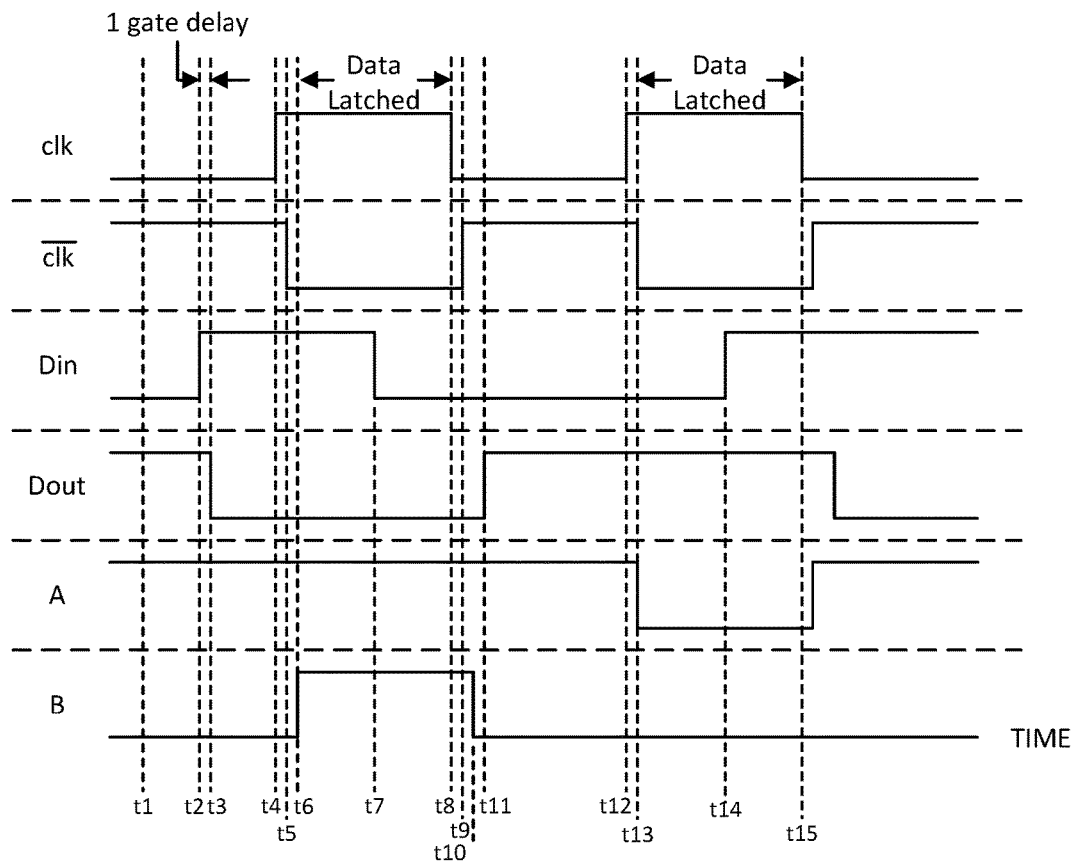
FIG. 2B illustrates a timing diagram of another set of exemplary signals related to an operation of the latch circuit of FIG. 2A in accordance with another aspect of the disclosure.

FIG. 2B illustrates a timing diagram of a set of exemplary signals related to an operation of the latch circuit 200 in accordance with another aspect of the disclosure.

Prior to time t4, when the clock signal clk is at a low logic voltage and the complementary clock signal $\overline{clk}$ is at a high logic voltage, the output data signal Dout tracks (albeit, inversely) the input data signal Din. The clock signal clk being low causes the NAND gate 230 to generate a signal "A" at a high logic voltage to enable the AND portion of the AND-NOR gate 210. The complementary clock signal $\overline{clk}$, being at a high logic voltage, causes the NOR gate 220 to generate a signal "B" at a low logic voltage to enable the NOR portion of the AND-NOR gate 210. Thus, the AND-NOR gate 210 passes the input data signal Din (albeit, inversely) to generate the output data signal Dout.

This can be seen in the timing diagram where at time t1, the input data signal Din is at a low logic voltage and the output data signal Dout is at a high logic voltage. Similarly, at time t2, when the input data signal Din transitions from a low to a high logic voltage, the output data signal Dout responsively transitions from a high to a low logic voltage at time t3 (after a one (1) gate delay from time t2). This is because there is a single gate (e.g., the OR-NAND gate 210) between the input and output of the latch circuit 200. Compared to latch circuit 100, the latch circuit 200 is able to latch data much faster with a one (1) gate propagation delay as compared to the latch circuit 100 with a three (3) gate propagation delay.

At times t4 and t5, the clock signal clk transitions from a low to a high logic voltage and the complementary clock signal $\overline{clk}$ responsively transitions from a high to a low logic voltage, respectively. The complementary clock signal $\overline{clk}$ being low enables the NOR gate 220 to invert the output data signal Dout to generate signal "B" at a high logic voltage at time t6. Thus, in this configuration, the AND-NOR gate 210 and the NOR gate 220 operate as two cross-coupled inverters to latch the output data signal Dout. This can be seen in the timing diagram where between times t6 and t8, the output data signal Dout is latched at a low logic voltage even though the input data signal Din transitions from high to low at time t7.

At times t8-t9, the clock signal clk transitions from a high to a low logic voltage, and the complementary clock signal $\overline{clk}$ responsively transitions from a low to a high logic voltage, respectively. The complementary clock signal $\overline{clk}$, being at a high logic voltage, causes the NOR gate 220 to generate signal "B" at a low logic voltage at time t10. The clock signal clk, being at a low logic voltage, causes the NAND gate 230 to continue generating signal "A" at a high logic voltage. The signal "A" being high and the signal "B" being low enable the AND-NOR 210 gate to pass and invert the input data signal Din to generate the output data signal Dout. Since, at time t10, the input data signal is at a low logic voltage, the output data signal Dout transitions from a low a high logic voltage at time t11 (one (1) gate delay from time t10).

Similarly, at times t12 and t13, the clock signal clk transitions from a low to a high logic voltage, and the complementary clock signal $\overline{clk}$ responsively transitions from a high to a low logic voltage, respectively. The clock signal clk and the output data signal Dout both being high causes the NAND gate 230 to generate signal "A" at a low logic voltage. The complementary clock signal $\overline{clk}$ being low enables the NOR gate 220 to invert the output data signal Dout to continue generating signal B at a low logic voltage at time t13. The signal "A" being low causes the AND portion to output a low intermediate signal. Thus, both inputs to the NOR portion is low, causing the AND-NOR gate 210 to generate the output data signal Dout at a high logic voltage.

In this configuration, the AND-NOR gate 210 and the NOR gate 220 operate as two cross-coupled inverters to latch the output data signal Dout. This can be seen in the timing diagram where between times t13 and t15, the output data signal Dout is latched at a high logic voltage even though the input data signal Din transitions from low to a high logic voltage at time t14.

Figure 3A:
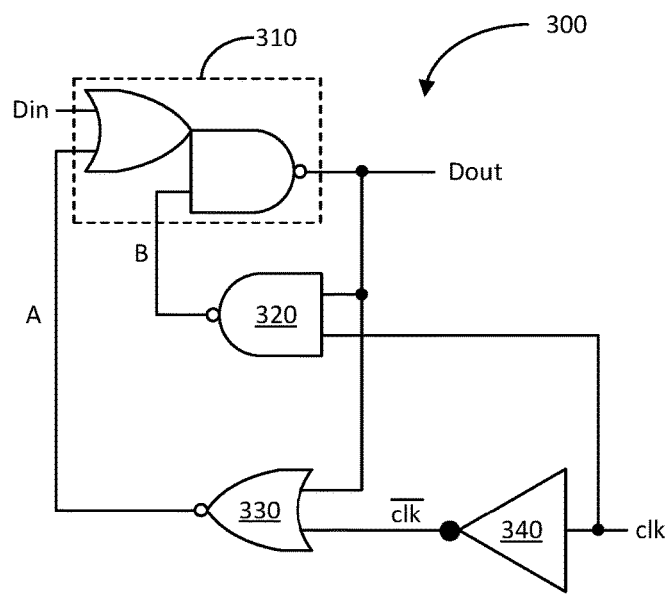
FIG. 3A illustrates a schematic diagram of another exemplary latch circuit in accordance with an aspect of the disclosure.

FIG. 3A illustrates a schematic diagram of another exemplary latch circuit 300 in accordance with another aspect of the disclosure. The latch circuit 300 is a variation of latch 200.

In particular, the latch circuit 300 includes an OR-NAND gate 310, a NAND gate 320, a NOR gate 330, and an inverter 340. Although, symbolically, the OR-NAND gate 310 is shown to include two gates, the OR-NAND gate 310 operates as a single gate, as discussed further herein with reference to an exemplary detailed embodiment.

The OR-NAND gate 310 includes a first OR-input configured to receive an input data signal Din. The OR-NAND gate 310 further includes a second OR-input coupled to an output of NOR gate 330. The OR-NAND gate 310 also includes a NAND-input coupled to an output of the NAND gate 320. The output of the OR-NAND gate 310, which produces an output data signal Dout, is coupled to respective first inputs of the NAND gate 320 and the NOR gate 330.

The NAND gate 320 includes a second input configured to receive a clock signal clk. The NOR gate 330 includes a second input configured to receive a complementary clock signal $\overline{clk}$ generated by the inverter 340 in response to the clock signal clk.

Figure 3B:
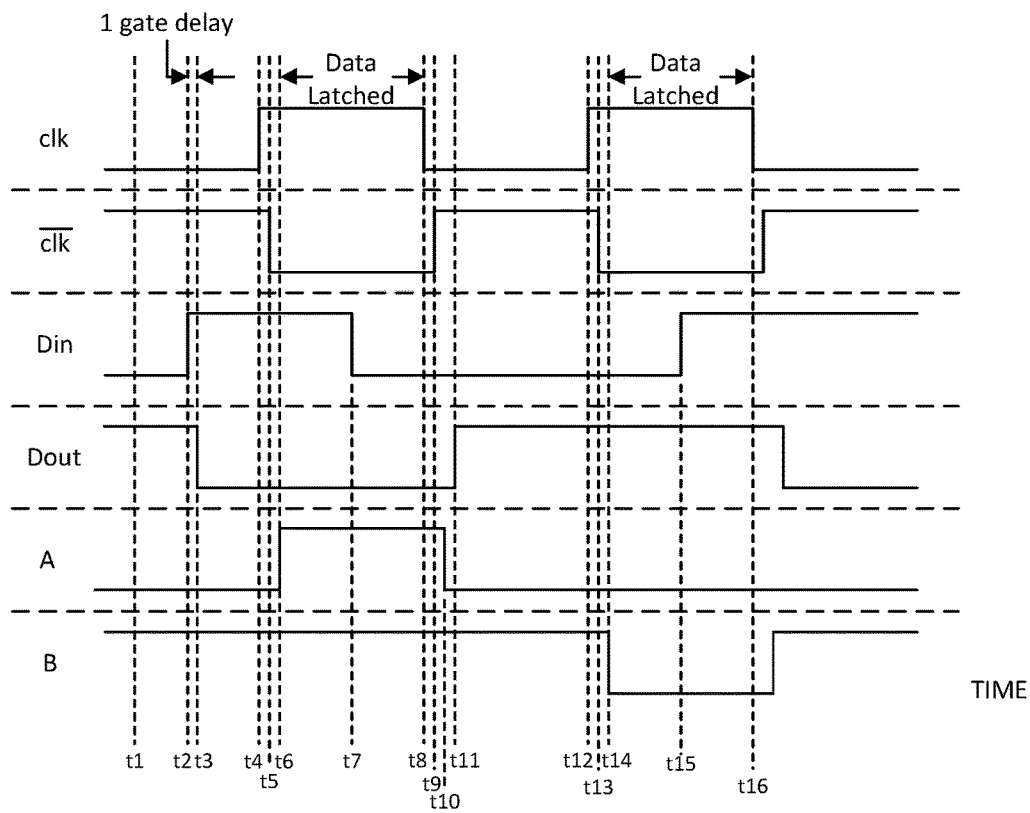
FIG. 3B illustrates a timing diagram of another set of exemplary signals related to an operation of the latch circuit of FIG. 3A in accordance with another aspect of the disclosure.

FIG. 3B illustrates a timing diagram of a set of exemplary signals related to an operation of the latch circuit 300 in accordance with another aspect of the disclosure.

Prior to time t4, when the clock signal clk is at a low logic voltage and the complementary clock signal $\overline{clk}$ is at a high logic voltage, the output data signal Dout tracks (albeit inversely) the input data signal Din. The complementary clock signal $\overline{clk}$ being high causes the NOR gate 330 to generate a signal "A" at a low logic voltage to enable the OR portion of the OR-NAND gate 310. The clock signal clk, being at a low logic voltage, causes the NAND gate 320 to generate a signal "B" at a high logic voltage to enable the NAND portion of the OR-NAND gate 310. Thus, the OR-NAND gate 310 passes the input data signal Din (albeit, inversely) to generate the output data signal Dout.

This can be seen in the timing diagram where at time t1, the input data signal Din is at a low logic voltage and the output data signal Dout is at a high logic voltage. Similarly, at time t2, when the input data signal Din transitions from a low to a high logic voltage, the output data signal Dout responsively transitions from a high to a low logic voltage at time t3 (after a one (1) gate delay from time t2). This is because there is a single gate (e.g., the OR-NAND gate 310) between the input and output in the latch circuit 300. Compared to latch circuit 100, the latch circuit 300 is able to latch data much faster with a one (1) gate propagation delay as compared to the latch circuit 100 with a three (3) gate propagation delay.

At times t4 and t5, the clock signal clk transitions from a low to a high logic voltage and the complementary clock signal $\overline{clk}$ responsively transitions from a high to a low logic voltage, respectively. The clock signal clk being high enables the NAND gate 320 to invert the low output data signal Dout to continue generating signal "B" at a high logic voltage at time t6. The complementary clock signal $\overline{clk}$ being low enables the NOR gate 330 to generate signal "A" at a high logic voltage at time t6. The signal "A" being high causes the OR portion to output a high intermediate signal. Thus, both inputs to the NAND portion are high, causing the OR-NAND gate 310 to generate the output data signal Dout at a low logic voltage.

Thus, in this configuration, the OR-NAND gate 310 and the NAND gate 320 operate as two cross-coupled inverters to latch the output data signal Dout. This can be seen in the timing diagram where between times t6 and t8, the output data signal Dout is latched at a low logic voltage even though the input data signal Din transitions from high to low at time t7.

At times t8-t9, the clock signal clk transitions from a high to a low logic voltage, and the complementary clock signal $\overline{clk}$ responsively transitions from a low to a high logic voltage, respectively. The clock signal clk, being at a low logic voltage, causes the NAND gate 320 to continue to generate signal "B" at a high logic voltage. The complementary clock signal $\overline{clk}$, being at a high logic voltage, causes the NOR gate 330 to generate signal "A" at a low logic voltage at time t10. The signal "A" being low and the signal "B" being high enable the OR-NAND gate 310 to pass the input data signal Din (albeit, inversely) to generate the output data signal Dout. Since, at time t10, the input data signal Din is at a low logic voltage, the output data signal Dout transitions from a low a high logic voltage at time t11 (one (1) gate delay from time t10).

Similarly, at times t12 and t13, the clock signal clk transitions from a low to a high logic voltage, and the complementary clock signal $\overline{\text{clk}}$ responsively transitions from a high to a low logic voltage, respectively. The clock signal clk being high enables the NAND gate 320 to invert the output data signal Dout to generating signal "B" at a low logic voltage at time t13. In this configuration, the OR-NAND gate 310 and the NAND gate 320 operate as two cross-coupled inverters to latch the output data signal Dout. This can be seen in the timing diagram where between times t14 and t16, the output data signal Dout is latched at a high logic voltage even though the input data signal Din transitions from low to a high logic voltage at time t15.

Figure 4:
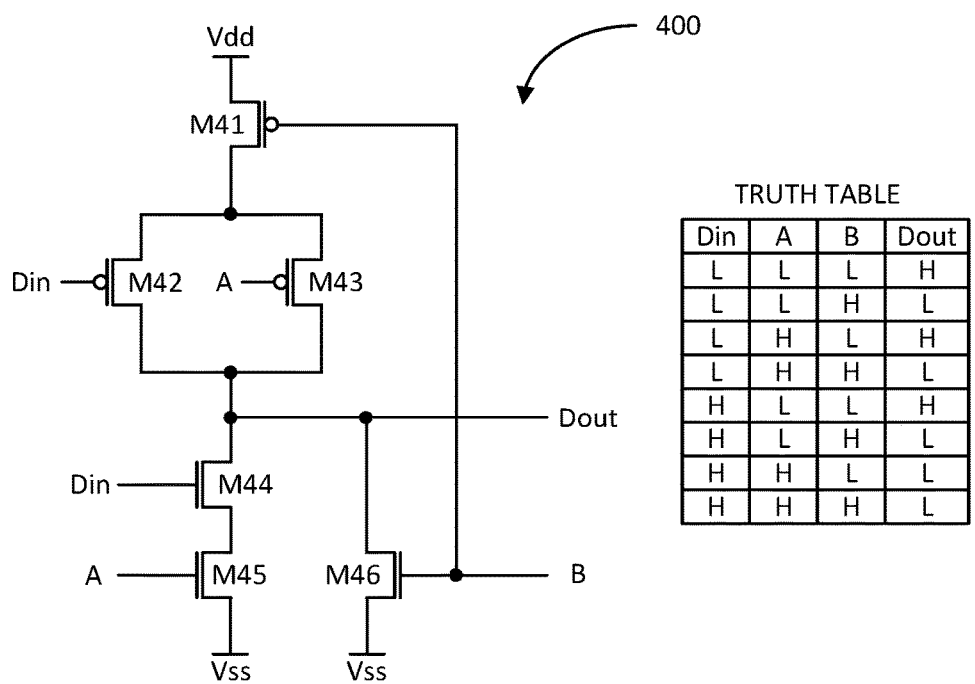
FIG. 4 illustrates a schematic diagram of an exemplary AND-NOR gate in accordance with another aspect of the disclosure.

FIG. 4 illustrates a schematic diagram of an exemplary AND-NOR gate 400 in accordance with another aspect of the disclosure. The AND-NOR gate 400 may be an exemplary detailed implementation of the AND-NOR gate 210 previously discussed. Also depicted in FIG. 4 is a truth table for the AND-NOR gate 400.

In particular, the AND-NOR gate 400 includes a p-channel metal oxide semiconductor (PMOS) field effect transistor (FETs) M41, M42, and M43, and n-channel metal oxide semiconductor (NMOS) FETs M44, M45, and M46. The PMOS FET M41 includes a source coupled to an upper voltage rail (Vdd), a gate configured to receive signal "B", and a drain coupled to the sources of PMOS FETs M42 and M43. The PMOS FETs M42 and M43 include gates configured to receive an input data signal Din and signal "A", respectively. The drains of the PMOS FETs M42 and M43 are coupled together to form an output of the AND-NOR gate 400, whereat an output data signal Dout is produced.

The NMOS FETs M44 and M46 include drains coupled to the output of the AND-NOR gate 400. The NMOS FET M44 includes a gate configured to receive the input data signal Din. The NMOS FET M46 includes a gate configured to receive signal "B". The NMOS FET M44 includes a source coupled to a drain of NMOS FET M45. The NMOS FET M46 includes a source coupled to a lower voltage rail (Vss). The NMOS FET M45 includes a gate configured to receive the "A" signal, and a source coupled to the lower voltage rail (Vss).

In operation, with reference to the truth table, when signal "B" is at a high logic voltage (H) (e.g., substantially Vdd) (as indicated in rows 2, 4, 6, and 8 of the truth table), the PMOS FET M41 if turned off and the NMOS FET M46 is turned on. The turned-off PMOS FET M41 isolates the output from the upper voltage rail (Vdd) and the turned-on NMOS FET M46 couples the output to the lower voltage rail (Vss). As a result, the output data signal Dout is at a low logic voltage regardless of the states of the input data signal Din and the "A" signal. With reference to FIG. 2B, this condition (B is high) occurs when the latch circuit 200 has latched a logic low output data signal Dout, as indicated between times t6 and t8.

When signal "B" is at a low logic voltage (L) (e.g., substantially Vss) (as indicated in rows 1, 3, 5, and 7 of the truth table), the PMOS FET M41 if turned on and the NMOS FET M46 is turned off. Under this condition, the state of the output data signal Dout is determined by the states of the input data signal Din and signal "A".

For instance, if the input data signal Din and signal "A" are both at low logic voltages (L) (as indicated in row 1 of the truth table), PMOS FETs M42 and M43 are turned on and NMOS FETs M44 and M45 are turned off. As a result, the output is coupled to the upper voltage rail (Vdd) via the turned-on PMOS FETs M41, M42, and M43, and isolated from the lower voltage rail (Vss) via the turned-off NMOS FETs M44, M45, and M46. As a result, the output data signal Dout is at a high logic voltage. With reference to FIG. 2B, this condition (Din, A, and B are low) occurs during an interval when the latch circuit 200 has latched a logic high output data signal Dout, as indicated between time t13 and time t14.

Considering again the case when signal "B" is low, if the input data signal Din is at a low logic voltage (L) and signal "A" is at a high logic voltage (H) (as indicated in row 3 of the truth table), PMOS FETs M42 and NMOS FET M45 are turned on and PMOS FET M43 and NMOS FET M44 are turned off. As a result, the output is coupled to the upper voltage rail (Vdd) via the turned-on PMOS FETs M41 and M42, and isolated from the lower voltage rail (Vss) via the turned-off NMOS FETs M44 and M46. As a result, the output data signal Dout is at a high logic voltage. With reference to FIG. 2B, this condition (Din and B are low, and A is high) occurs during an interval when the latch circuit 200 is in an unlatched state and the input data signal Din is at a low logic voltage, as indicated between times t11 and t12.

Considering again the case when signal "B" is low, if the input data signal Din is at a high logic voltage (H) and signal "A" is at a low logic voltage (L) (as indicated in row 5 of the truth table), PMOS FETs M43 and NMOS FET M44 are turned on and PMOS FET M42 and NMOS FET M45 are turned off. As a result, the output is coupled to the upper voltage rail (Vdd) via the turned-on PMOS FETs M41 and M43, and isolated from the lower voltage rail (Vss) via the turned-off NMOS FETs M45 and M46. As a result, the output data signal Dout is at a high logic voltage. With reference to FIG. 2B, this condition (A and B are low, and Din is high) occurs during an interval when the latch circuit 200 has latched a logic high output data signal Dout, as indicated between times t14 and t15.

Considering again the case when signal "B" is low, if the input data signal Din and signal "A" are both at high logic voltages (H) (as indicated in row 7 of the truth table), PMOS FETs M43 and M44 are turned off and NMOS FETs M44 and M45 are turned on. As a result, the output is isolated from the upper voltage rail (Vdd) via the turned-off PMOS FETs M42 and M43, and coupled to the lower voltage rail (Vss) via the turned-on NMOS FETs M44 and M45. As a result, the output data signal Dout is at a low logic voltage. With reference to FIG. 2B, this condition (Din and A are high, and B is low) occurs during an interval when the latch circuit 200 is in an unlatched state and the input data signal Din is at a high logic voltage, as indicated between times t3 and t4.

Figure 5:
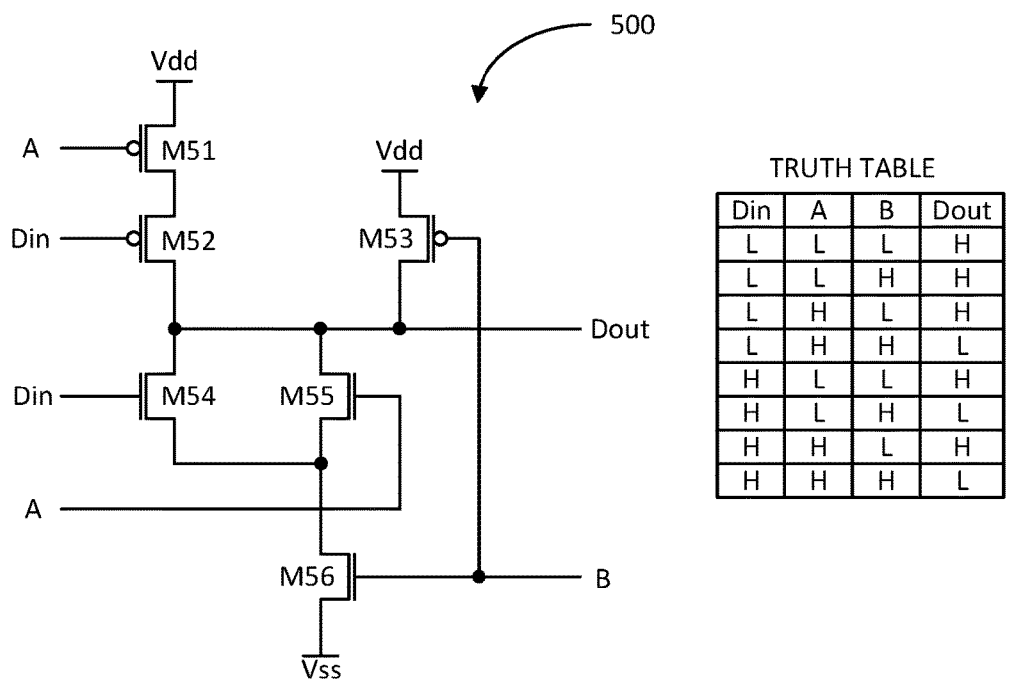
FIG. 5 illustrates a schematic diagram of an exemplary OR-NAND gate in accordance with another aspect of the disclosure.

FIG. 5 illustrates a schematic diagram of an exemplary OR-NAND gate 500 in accordance with another aspect of the disclosure. The OR-NAND gate 500 may be an exemplary detailed implementation of the OR-NAND gate 310 previously discussed. Also depicted in FIG. 5 is a truth table for the OR-NAND gate 500.

In particular, the OR-NAND gate 500 includes PMOS FETs M51, M52, and M53, and NMOS FETs M54, M55, and M56. The PMOS FET M51 includes a source coupled to an upper voltage rail (Vdd), a gate configured to receive signal "A", and a drain coupled to the source of PMOS FET M52. The PMOS FETs M52 includes a gate configured to receive the input data signal Din and a drain coupled to an output of the OR-NAND gate 500, whereat the output data signal Dout is produced. The PMOS FET M53 includes a source coupled to the upper voltage rail (Vdd), a gate configured to receive signal "B", and a drain coupled to the output of the OR-NAND gate 500.

The NMOS FETs M54 and M55 include drains coupled to the output of the OR-NAND gate 500. The NMOS FET M54 includes a gate configured to receive the input data signal Din. The NMOS FET M55 includes a gate configured to receive signal "A". The NMOS FETs M54 and M55 include sources coupled to a drain of NMOS FET M56. The NMOS FET M56 includes a gate configured to receive signal "B", and a source coupled to the lower voltage rail (Vss).

In operation, with reference to the truth table, when signal "B" is at a low logic voltage (L) (e.g., substantially Vss) (as indicated in rows 1, 3, 5, and 7 of the truth table), the PMOS FET M53 if turned on and the NMOS FET M56 is turned off. The turned-on PMOS FET M53 couples the output to the upper voltage rail (Vdd) and the turned-off NMOS FET M56 isolates the output from the lower voltage rail (Vss). As a result, the output data signal Dout is at a high logic voltage regardless of the states of the input data signal Din and signal "A". With reference to FIG. 3B, this condition (B is low) occurs when the latch circuit 300 has latched a logic high output data signal Dout, as indicated between times t14 and t16.

When signal "B" is at a high logic voltage (H) (e.g., substantially Vdd) (as indicated in rows 2, 4, 6, and 8 of the truth table), the PMOS FET M53 if turned off and the NMOS FET M56 is turned on. Under this condition, the state of the output data signal Dout is determined by the states of the input data signal Din and the "A" signal.

For instance, if the input data signal Din and signal "A" are both at low logic voltages (L) (as indicated in row 2 of the truth table), PMOS FETs MM and M52 are turned on and NMOS FETs M54 and M55 are turned off. As a result, the output is coupled to the upper voltage rail (Vdd) via the turned-on PMOS FETs M51 and M52, and isolated from the lower voltage rail (Vss) via the turned-off NMOS FETs M54 and M55. As a result, the output data signal Dout is at a high logic voltage. With reference to FIG. 3B, this condition (Din and A are low, and B is high) occurs during an interval when the latch circuit 300 is in an unlatched state and the input data signal Din is at a low logic state, as indicated between times t11 and time t12.

Considering again the case when signal "B" is high, if the input data signal Din is at a low logic voltage (L) and signal "A" is at a high logic voltage (H) (as indicated in row 4 of the truth table), PMOS FETs M51 is turned off and NMOS FET M55 is turned on. As a result, the output is isolated from the upper voltage rail (Vdd) via the turned-off PMOS FETs M51, and coupled to the lower voltage rail (Vss) via the turned-on NMOS FETs M55 and M56. As a result, the output data signal Dout is at a low logic voltage. With reference to FIG. 3B, this condition (Din is low, and A and B are high) occurs during an interval when the latch circuit 300 has latched a logic low output data signal Dout, as indicated between times t7 and t8.

Considering again the case when signal "B" is high, if the input data signal Din is at a high logic voltage (H) and signal "A" is at a low logic voltage (L) (as indicated in row 6 of the truth table), PMOS FETs M52 is turned off and NMOS FET M54 is turned on. As a result, the output is isolated from the upper voltage rail (Vdd) via the turned-off PMOS FETs M52, and coupled to the lower voltage rail (Vss) via the turned-on NMOS FETs M54 and M56. As a result, the output data signal Dout is at a low logic voltage. With reference to FIG. 3B, this condition (A is low, and Din and B are high) occurs during an interval when the latch circuit 300 is in an unlatched state and the input data signal Din is at a low logic voltage, as indicated between times t3 and t4.

Considering again the case when signal "B" is high, if the input data signal Din and signal "A" are both at high logic voltages (H) (as indicated in row 8 of the truth table), PMOS FETs MM and M52 are turned off and NMOS FETs M54 and M55 are turned on. As a result, the output is isolated from the upper voltage rail (Vdd) via the turned-off PMOS FETs MM and M52, and coupled to the lower voltage rail (Vss) via the turned-on NMOS FETs M54 and M55. As a result, the output data signal Dout is at a low logic voltage. With reference to FIG. 3B, this condition (Din, A, and B are high) occurs during an interval when the latch circuit 300 has latched a logic low output data signal Dout, as indicated between times t6 and t7.

Figure 6:
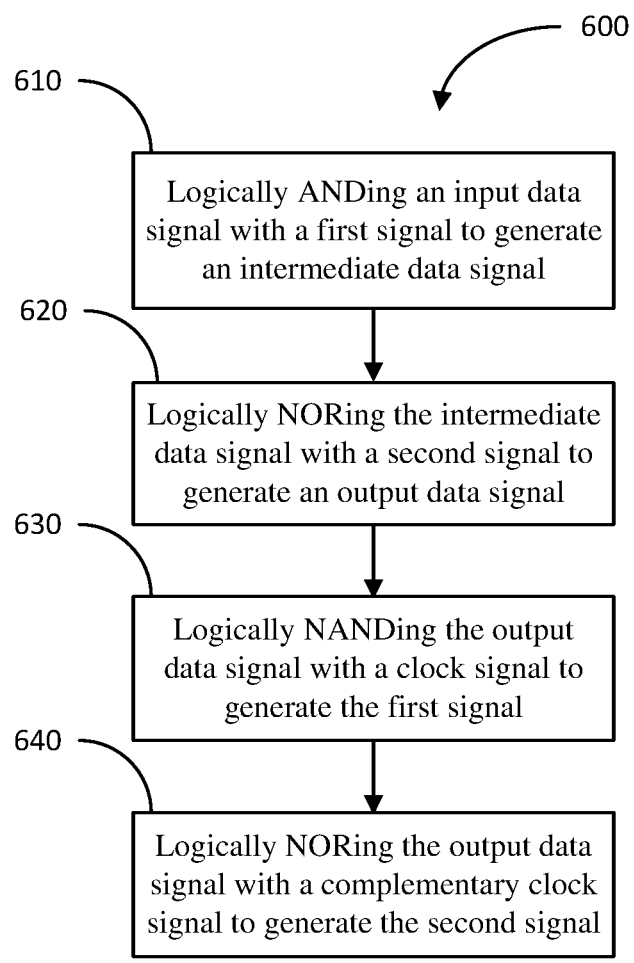
FIG. 6 illustrates a flow diagram of an exemplary method of latching data in accordance with another aspect of the disclosure.

FIG. 6 illustrates a flow diagram of an exemplary method 600 of latching data in accordance with another aspect of the disclosure.

The method 600 includes logically ANDing an input data signal with a first signal to generate an intermediate data signal (block 610). An example of a means for logically ANDing an input data signal with a first signal to generate an intermediate data signal includes the AND-NOR gate 210 previously described.

The method 600 further includes logically NORing the intermediate data signal with a second signal to generate an output data signal (block 620). An example of a means for logically NORing the intermediate data signal with a second signal to generate an output data signal includes the AND-NOR gate 210.

The method 600 also includes logically NANDing the output data signal with a clock signal to generate the first signal (block 630). An example of a means for logically NANDing the output data signal with a clock signal to generate the first signal includes the NAND gate 230 previously described.

Additionally, the method 600 includes logically NORing the output data signal with a complementary clock signal to generate the second signal (block 640). An example of a means for logically NORing the output data signal with a complementary clock signal to generate the second signal includes the NOR gate 220 previously described.

Figure 7:
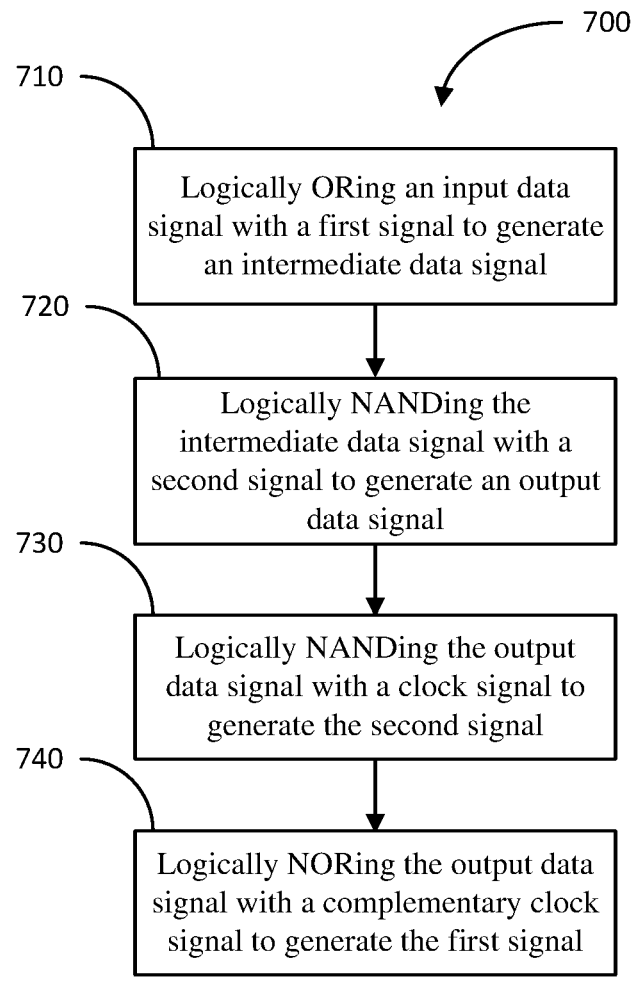
FIG. 7 illustrates a flow diagram of another exemplary method of latching data in accordance with another aspect of the disclosure.

FIG. 7 illustrates a flow diagram of an exemplary method 700 of latching data in accordance with another aspect of the disclosure.

The method 700 includes logically ORing an input data signal with a first signal to generate an intermediate data signal (block 710). An example of a means for logically ORing an input data signal with a first signal to generate an intermediate data signal includes the OR-NAND gate 310 previously described.

The method 700 further includes logically NANDing the intermediate data signal with a second signal to generate an output data signal (block 720). An example of a means for logically NANDing the intermediate data signal with a second signal to generate an output data signal includes the OR-NAND gate 310.

The method 700 also includes logically NANDing the output data signal with a clock signal to generate the second signal (block 730). An example of a means for logically NANDing the output data signal with a clock signal to generate the second signal includes the NAND gate 320 previously described.

Additionally, the method 700 includes logically NORing the output data signal with a complementary clock signal to generate the first signal (block 740). An example of a means for logically NORing the output data signal with a complementary clock signal to generate the first signal includes the NOR gate 330 previously described.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
an AND-NOR gate configured to generate an output data signal at an output based on an input data signal, wherein the AND-NOR gate includes a first AND-input configured to receive the input data signal;
a NAND gate including a first input coupled to the output of the AND-NOR gate, a second input configured to receive a clock signal, and an output coupled to a second AND-input of the AND-NOR gate; and
a NOR gate including a first input coupled to the output of the AND-NOR gate, a second input configured to receive a complementary clock signal, and an output coupled to a NOR-input of the AND-NOR gate;
wherein the AND-NOR gate comprises:
a first transistor including a first control terminal coupled to the output of the NOR gate;
a second transistor including a second control terminal configured to receive the input data signal;
a third transistor including a third control terminal coupled to the output of the NAND gate, wherein the first transistor is coupled in series with a parallel coupling of the second and third transistors between an upper voltage rail and the output of the AND-NOR gate;
a fourth transistor including a fourth control terminal configured to receive the input data signal;
a fifth transistor including a fifth control terminal coupled to the output of the NAND gate; and
a sixth transistor including a sixth control terminal coupled to the output of the NOR gate, wherein the sixth transistor is coupled in parallel with a series coupling of the fourth and fifth transistors between the output of the AND-NOR gate and a lower voltage rail.

2. The apparatus of claim 1, further comprising an inverter configured to generate the complementary clock signal based on the clock signal.

3. The apparatus of claim 1, wherein at least one of the first, second, and third transistors is a p-channel metal oxide semiconductor (PMOS) field effect transistor.

4. The apparatus of claim 1, wherein at least one of the fourth, fifth, and sixth transistors is an n-channel metal oxide semiconductor (NMOS) field effect transistor.

5. A method, comprising:
logically ANDing an input data signal with a first signal to generate an intermediate data signal;
logically NORing the intermediate data signal with a second signal to generate an output data signal;
logically NANDing the output data signal with a clock signal to generate the first signal; and
logically NORing the output data signal with a complementary clock signal to generate the second signal;
wherein logically ANDing the input data signal with the first signal and logically NORing the intermediate data signal with the second signal is performed by an AND-NOR gate, and wherein the AND-NOR gate comprises:
a first transistor including a first control terminal configured to receive the second signal;
a second transistor including a second control terminal configured to receive the input data signal;
a third transistor including a third control terminal configured to receive the first signal, wherein the first transistor is coupled in series with a parallel coupling of the second and third transistors between an upper voltage rail and an output of the AND-NOR gate;
a fourth transistor including a fourth control terminal configured to receive the input data signal;
a fifth transistor including a fifth control terminal configured to receive the first signal; and
a sixth transistor including a sixth control terminal configured to receive the second signal, wherein the sixth transistor is coupled in parallel with a series coupling of the fourth and fifth transistors between the output of the AND-NOR gate and a lower voltage rail.

6. The method of claim 5, wherein at least one of the first, second, and third transistors is a p-channel metal oxide semiconductor (PMOS) field effect transistor.

7. The method of claim 5, wherein at least one of the fourth, fifth, and sixth transistors is an n-channel metal oxide semiconductor (NMOS) field effect transistor.

8. An apparatus, comprising:
an OR-NAND gate configured to generate an output data signal at an output based on an input data signal, wherein the OR-NAND gate includes a first OR-input configured to receive the input data signal;
a NAND gate including a first input coupled to the output of the OR-NAND gate, a second input configured to receive a clock signal, and an output coupled to a NAND-input of the OR-NAND gate; and
a NOR gate including a first input coupled to the output of the OR-NAND gate, a second input configured to receive a complementary clock signal, and an output coupled to a second OR-input of the OR-NAND gate;
wherein the OR-NAND gate comprises:
a first transistor including a first control terminal coupled to the output of the NOR gate;
a second transistor including a second control terminal configured to receive the input data signal, wherein the first and second transistors are coupled in series between an upper voltage rail and the output of the OR-NAND gate;
a third transistor including a third control terminal coupled to the output of the NAND gate, wherein the third transistor is coupled between the upper voltage rail and the output of the OR-NAND gate;
a fourth transistor including a fourth control terminal configured to receive the input data signal;
a fifth transistor including a fifth control terminal coupled to the output of the NOR gate; and
a sixth transistor including a sixth control terminal coupled to the output of the NAND gate, wherein a parallel coupling of the fourth and fifth transistors is coupled in series with the sixth transistor between the output of the OR-NAND gate and a lower voltage rail.

9. The apparatus of claim 8, further comprising an inverter configured to generate the complementary clock signal based on the clock signal.

10. The apparatus of claim 8, wherein at least one of the first, second, and third transistors is a p-channel metal oxide semiconductor (PMOS) field effect transistor.

11. The apparatus of claim 8, wherein at least one of the fourth, fifth, and sixth transistors is an n-channel metal oxide semiconductor (NMOS) field effect transistor.

12. A method, comprising:
  logically ORing an input data signal with a first signal to generate an intermediate data signal;
  logically NANDing the intermediate data signal with a second signal to generate an output data signal;
  logically NANDing the output data signal with a clock signal to generate the second signal; and
  logically NORing the output data signal with a complementary clock signal to generate the first signal;
  wherein logically ORing the input data signal with the first signal and logically NANDing the intermediate data signal with the second signal is performed by an OR-NAND gate, and wherein the OR-NAND gate comprises:
    a first transistor including a first control terminal configured to receive the first signal;
    a second transistor including a second control terminal configured to receive the input data signal, wherein the first and second transistors are coupled in series between an upper voltage rail and the output of the OR-NAND gate;
    a third transistor including a third control terminal configured to receive the second signal, wherein the third transistor is coupled between the upper voltage rail and the output of the OR-NAND gate;
    a fourth transistor including a fourth control terminal configured to receive the input data signal;
    a fifth transistor including a fifth control terminal configured to receive the first signal; and
    a sixth transistor including a sixth control terminal configured to receive the second signal, wherein a parallel coupling of the fourth and fifth transistors is coupled in series with the sixth transistor between the output of the OR-NAND gate and a lower voltage rail.

13. The method of claim 12, wherein at least one of the first, second, and third transistors is a p-channel metal oxide semiconductor (PMOS) field effect transistor.

14. The method of claim 12, wherein at least one of the fourth, fifth, and sixth transistors is an n-channel metal oxide semiconductor (NMOS) field effect transistor.

* * * * *